United States Patent
Wu et al.

(10) Patent No.: US 9,857,689 B2
(45) Date of Patent: Jan. 2, 2018

(54) METHOD FOR FABRICATING PATTERN USING SUPPORTING ASSEMBLY WITH ROLLING MEMBER DISPOSED BELOW SUPPORTING RODS AND SEMICONDUCTOR FABRICATION APPARATUS HAVING THE SUPPORTING ASSEMBLY

(71) Applicant: UNITED MICROELECTRONICS CORP., Hsin-Chu (TW)

(72) Inventors: Chien-Ju Wu, Chiayi County (TW); Ming-Sung Wu, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 63 days.

(21) Appl. No.: 15/190,165

(22) Filed: Jun. 22, 2016

(65) Prior Publication Data
US 2016/0299434 A1    Oct. 13, 2016

Related U.S. Application Data

(62) Division of application No. 14/138,150, filed on Dec. 23, 2013, now Pat. No. 9,400,431.

(51) Int. Cl.
| | |
|---|---|
| *G03B 27/54* | (2006.01) |
| *G03B 27/58* | (2006.01) |
| *G03B 27/62* | (2006.01) |
| *H02K 41/02* | (2006.01) |
| *G03F 7/20* | (2006.01) |

(Continued)

(52) U.S. Cl.
CPC ............. *G03F 7/2041* (2013.01); *F16L 3/01* (2013.01); *F16L 3/10* (2013.01); *F16L 3/2235* (2013.01); *G03F 7/709* (2013.01); *G03F 7/70341* (2013.01); *G03F 7/70816* (2013.01); *G03F 7/70825* (2013.01); *H01L 21/0335* (2013.01); *H01L 21/0337* (2013.01); *H01L 21/0338* (2013.01); *H01L 21/3086* (2013.01)

(58) Field of Classification Search
CPC ... F16L 3/01; F16L 3/10; F16L 3/2235; G03F 7/2041; G03F 7/70341; G03F 7/70816; G03F 7/70825; G03F 7/709; H01L 21/0335; H01L 21/0337; H01L 21/0338; H01L 21/3086
USPC ................ 310/12.06; 355/30, 55, 67, 72, 75
See application file for complete search history.

(56) References Cited

U.S. PATENT DOCUMENTS

| | | |
|---|---|---|
| 1,121,780 A | 12/1914 | Vakula |
| 1,704,473 A | 3/1929 | Greene |

(Continued)

*Primary Examiner* — Colin Kreutzer
(74) *Attorney, Agent, or Firm* — Winston Hsu

(57) ABSTRACT

A method for fabricating a pattern on a semiconductor substrate, comprising the steps of: (a) providing the semiconductor substrate having a photosensitive layer thereon; (b) transmitting the semiconductor substrate to an exposure apparatus including several tubes; (c) providing the supporting assembly to support the tubes, where the supporting assembly includes a first supporting rod having several first parallel recesses, a second supporting rod disposed opposite to the first supporting rod, a bridging member connected to one end of the first supporting rod or one end of the second supporting rod; and a rolling member received by the bridging member; (d) providing a photomask to the exposure apparatus; and (e) transferring the pattern from the photomask to the photosensitive layer.

11 Claims, 3 Drawing Sheets

(51) Int. Cl.
*H01L 21/308* (2006.01)
*F16L 3/10* (2006.01)
*F16L 3/01* (2006.01)
*F16L 3/223* (2006.01)
*H01L 21/033* (2006.01)

(56) References Cited

U.S. PATENT DOCUMENTS

| | | |
|---|---|---|
| 3,526,934 A | 9/1970 | Owens, Sr. |
| 5,042,557 A | 8/1991 | Norsworthy |
| 5,115,542 A | 5/1992 | Gehres |
| 5,167,388 A | 12/1992 | Blair |
| 5,257,794 A | 11/1993 | Nakamura |
| 5,429,615 A | 7/1995 | Starchevich |
| 5,443,232 A | 8/1995 | Kesinger |
| 5,484,150 A | 1/1996 | Yasutomi |
| 5,941,483 A | 8/1999 | Baginski |
| 6,540,531 B2 | 4/2003 | Syed |
| 7,849,667 B2 | 12/2010 | Jaeker |
| 8,256,722 B2 | 9/2012 | Krastev |
| 8,672,276 B2 | 3/2014 | Fukumoto |
| 8,695,929 B2 | 4/2014 | Cox |
| 8,708,290 B2 | 4/2014 | Franta |
| 2003/0137643 A1* | 7/2003 | Jacobs ............... G03F 7/70991 355/53 |
| 2015/0187460 A1 | 7/2015 | DeLoache |

* cited by examiner

METHOD FOR FABRICATING PATTERN USING SUPPORTING ASSEMBLY WITH ROLLING MEMBER DISPOSED BELOW SUPPORTING RODS AND SEMICONDUCTOR FABRICATION APPARATUS HAVING THE SUPPORTING ASSEMBLY

CROSS REFERENCE TO RELATED APPLICATIONS

The application is a division application of U.S. application Ser. No. 14/138,150, filed on 2013 Dec. 23, the disclosure of which is hereby incorporated herein by reference in its entirety.

BACKGROUND OF THE INVENTION

1. Field of the Invention

The present invention generally relates to the field of a supporting apparatus, and more particularly to a method of fabricating a pattern using a supporting assembly and a fabrication apparatus including the supporting assembly.

2. Description of the Prior Art

With the increasing miniaturization of semiconductor devices, a variety of projection exposure apparatuses used to transfer patterns from a reticle to a substrate have been invented. Currently, in order to improve both the resolutions and the depth of the focus (DOF), immersion exposure apparatuses have been developed and are widely adopted by the semiconductor manufactures.

Briefly, the basic working principle of the immersion exposure apparatus is that the space between an objective lens and a photosensitive layer can be filled with high-index liquid during an exposure process. By the use of high-index liquid, the light passing through the objective lens may be further concentrated before it reaches the surface of the photosensitive layer. In this way, the dimensions of patterns formed in the photosensitive layer may be decreased effectively without reducing the depth of the focus.

Furthermore, in order to apply high-index liquid to the space between the objective lens and the photosensitive layer, a liquid supply apparatus including several flexible tubes is often equipped in the immersion exposure apparatus. The flexible tubes are often indirect contact with an underlying platform and are used to transport liquid from containers to the immersion exposure apparatus. During the operation of the immersion exposure apparatus, the flexible tubes often move back and forth on the platform. The flexible tubes, however, often need to be replaced since they inevitably wear out during the movement. This replacement causes unnecessary expenses and is often time consuming. Therefore, there is a need to solve these problems.

SUMMARY OF THE INVENTION

One object of embodiments of the present invention is to provide a method of fabricating a pattern using a supporting assembly and a fabrication apparatus including the supporting assembly so as to overcome the above mentioned problems.

According to one embodiment of the present invention, a method for fabricating a pattern on a semiconductor substrate, comprising the steps of: (a) providing the semiconductor substrate having a photosensitive layer thereon; (b) transmitting the semiconductor substrate to an exposure apparatus including several tubes; (c) providing the supporting assembly to support the tubes, where the supporting assembly includes a first supporting rod having several first parallel recesses, a second supporting rod disposed opposite to the first supporting rod, a bridging member connected to one end of the first supporting rod or one end of the second supporting rod; and a rolling member received by the bridging member; (d) providing a photomask to the exposure apparatus; and (e) transferring the pattern from the photomask to the photosensitive layer.

According to another embodiment of the present invention, a semiconductor fabrication apparatus disposed on a platform includes an immersion exposure apparatus and a supporting assembly. The immersion exposure apparatus is disposed on the platform and includes a support plate, a projection optical lens disposed above the support plate; and several tubes in which one end of each of the tubes is disposed between the support plate and the projection optical lens and the other end of each of the tubes extends out of the immersion exposure apparatus. The supporting assembly is disposed on the platform and includes a first supporting rod, a second supporting rod opposite to the first supporting rod, a bridging member, and a rolling member. The first supporting rod includes several parallel recesses. The bridging member is connected to one end of the first supporting rod or one end of the second supporting rod. The rolling member is received by the bridging member.

One main characteristic of the embodiment is that the tubes are able to be received by the parallel recesses and therefore to be supported by the supporting assembly. In this way, friction between the tubes and an underlying platform can be avoided. As a result, the tubes may be moved above the underlying platform without wearing out and the lifetime of the tubes may be improved.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
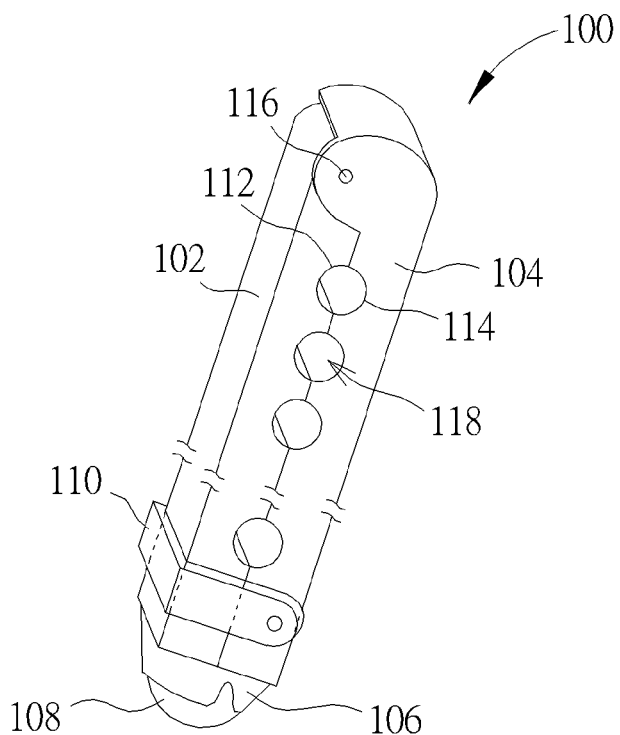
FIG. 1 is a schematic perspective diagram showing a supporting assembly according to one embodiment of the present invention.

In the following description, numerous specific details are given to provide a thorough understanding of the invention. It will, however, be apparent to one skilled in the art that the invention may be practiced without these specific details. Furthermore, some well-known system configurations and process steps are not disclosed in detail, as these should be well-known to those skilled in the art.

Likewise, the drawings showing embodiments of the apparatus are not to scale and some dimensions are exaggerated for clarity of presentation. Also, where multiple embodiments are disclosed and described as having some features in common, like or similar features will usually be described with same reference numerals for ease of illustration and description thereof.

Figure 2:
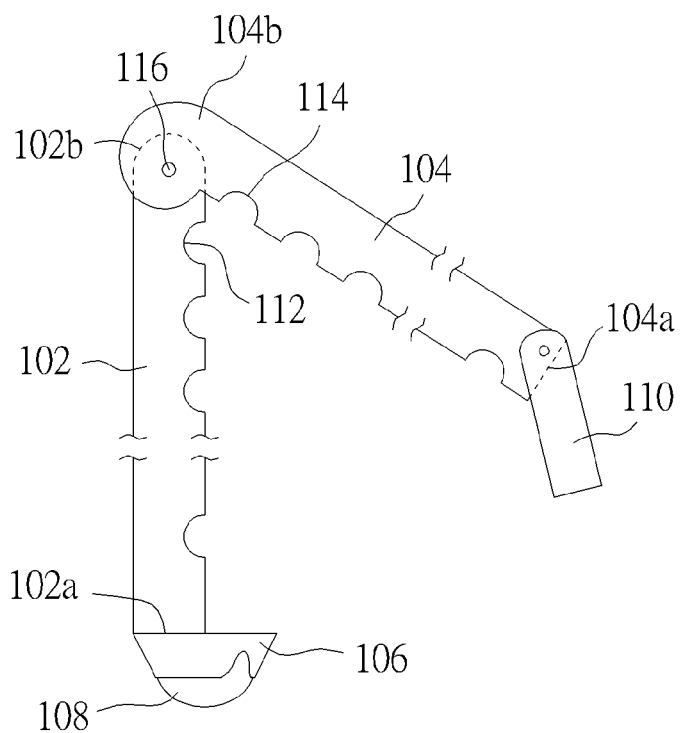
FIG. 2 is a schematic side view of FIG. 1 showing a supporting assembly according to one embodiment of the present invention.

Please refer to FIG. 1 and FIG. 2. FIG. 1 is a schematic perspective diagram showing a supporting assembly according to a first embodiment of the present invention. FIG. 2 is schematic side view of FIG. 1 showing a structure of a supporting assembly according to a first embodiment of the present invention. Referring to FIG. 1 and FIG. 2, a supporting assembly 100 is provided. The supporting assembly 100 includes at least a first supporting rod 102, a second supporting rod 104 disposed opposite to the first supporting rod 102, a bridging member 106, a rolling member 108, and an optional fastening member 110. The bridging member 106 is connected to a lower end 102a of the first supporting rod 102 and is used to receive the rolling member 108, such as a rolling ball. Preferably, the first supporting rod 102 is pivotally connected to the second supporting rod 104 by a pivot point 116. For example, an upper end 102b of the first supporting rod 102 is pivotally connected to an upper end 104b of the second supporting rod 104. In this way, a lower end 104a of the second supporting rod 104 is able to move along an arc path to approach or separate from the lower end 102a of the first supporting rod 102. Besides, the optional fastening member 110 may be used to fasten the first supporting rod 102 to the second supporting rod 104. In detail, the optional fastening member 110 is pivotally connected to the lower end 104a of the second supporting rod 104. When the fastening member 110 is at a locked position, the first supporting rod 102 may be tightly fastened to the second supporting rod 104. Preferably, the type of the fastening member 110 according to the present embodiment is a rotatable shell. However, there may also be another suitable type of fastening member, such as a bolt, a lock, a screw, or a clasp, but not limited thereto. Furthermore, the first supporting rod 102 and the second supporting rod 104 may respectively include first parallel recesses 112 and second parallel recesses 114 having arc or semicircular contours. As shown in FIG. 1, the first parallel recesses 112 are oppositely disposed to the second parallel recess 114 and a pair of the first parallel recess 112 and the second parallel recess 114 may constitute a through hole 118 with a cylindrical contour. Preferably, each of the through holes 118 is designed to receive a flexible tube and this characteristic is described in the following paragraphs.

The structure of the supporting assembly 100 is briefly disclosed in the preceding paragraph. According to the first embodiment of the present invention, one purpose of the supporting assembly is to support tubes used in semiconductor fabrication apparatuses. For example, the supporting assembly may be configured to support flexible tubes used in an exposure apparatus. For the sake of clarity, the function and the working principle of the supporting assembly is disclosed in detail in the following paragraphs.

Figure 3:
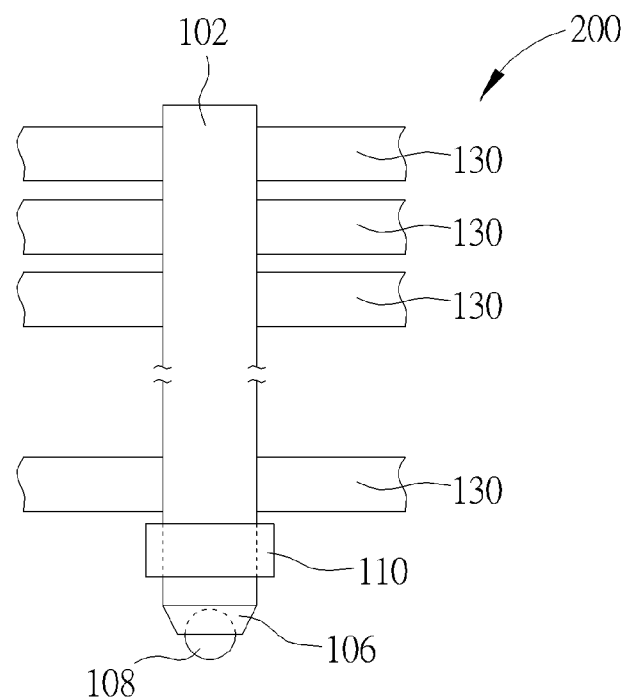
FIG. 3 is a schematic side view showing a supporting assembly with several tubes according to one embodiment of the present invention.

Please refer to FIG. 3. FIG. 3 is a schematic side view showing a supporting assembly with several tubes according to one embodiment of the present invention. Referring to FIG. 3, the first supporting rod 102 is fastened to the second supporting rod 104 by moving the fastening member 110 to the locked position. At this time, several tubes 130 are able to be tightly received by the through holes 118 of the supporting assembly 100. Precisely, in order to transport fluids, two ends of each of the tubes 130 maybe respectively connected to a tank filled with fluids and a fabrication apparatus. In this way, fluids, such as gas or liquid, may be transported from the tank to an interior of the fabrication apparatus. Since the tubes 130 may move back and forth during the operation of the fabrication apparatus, they are preferably made of flexible materials, such as rubber or plastic.

Figure 4:
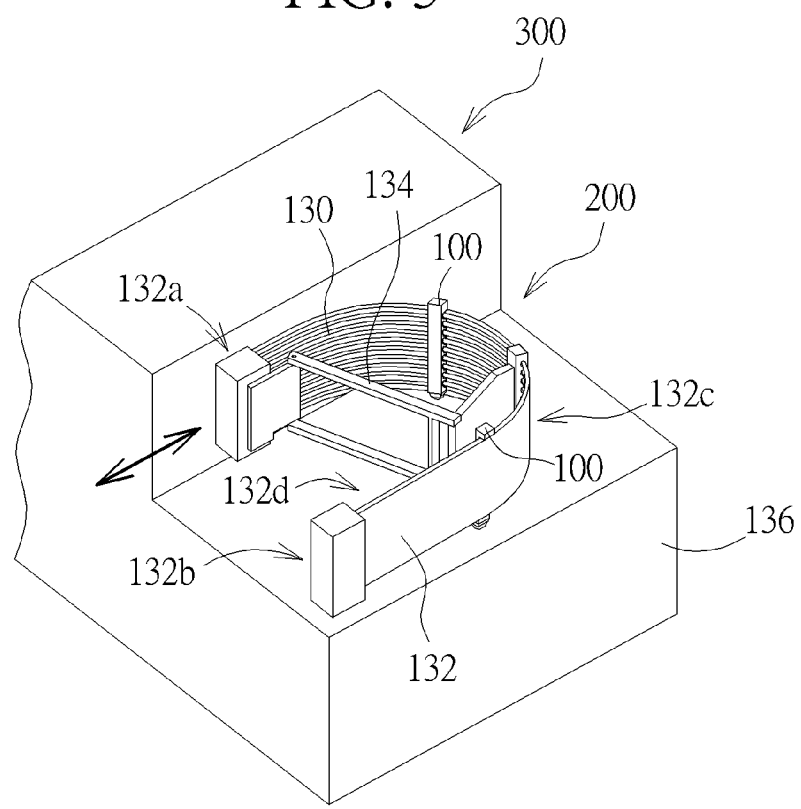
FIG. 4 is a schematic perspective diagram showing a support mechanism connected to a fabrication apparatus according to one embodiment of the present invention.

Please refer to FIG. 4. FIG. 4 is a schematic perspective diagram showing a support mechanism according to a first embodiment of the present invention. Referring to FIG. 4, the tubes 130 may extend outwardly from one side of a fabrication apparatus 300 and supported by a support mechanism 200. Precisely, the support mechanism 200 is disposed on a platform 132 and includes at least the supporting assembly 100, a flexible plate 132, and an optional supporting linkage 134. For example, the flexible plate 132 has a movable end 132a, a static end 132b, a curved portion 132c, and a straight portion 132d. During the operation of the exposure apparatus 300, the movable end 132a may move linearly and reciprocate in opposite directions, while the static end 132b is fixed. The curved portion 132c of the flexible plate 132 may be moved correspondingly due to the movement of the movable end 132a. Besides, in order to reinforce the strength of the flexible plate 132, especially the strength of the curved portion 132c, the supporting linkage 134 may link the curved portion 132c to the movable end 132a, but not limited thereto. It should be noted that the tubes 130 are disposed side-by-side on an inner surface of the flexible plate 132 and portions of each of the tubes 130 are received by the through hole 118 of the supporting assembly 100. One main characteristic of the first embodiment of the present invention is that the supporting assembly 100 can support the tubes 130 and move on the surface of the platform 132. In detail, since the rolling element 108 directly contacts the platform 132 during the movement of the curved portion 132c, the tubes 130 and/or flexible plate 132 may be spaced apart from the platform 132 by the supporting assembly 100. In this way, there is no friction between the tubes 130 and the platform 132 and the support mechanism 200 may move on the platform 132 smoothly. Preferably, the supporting assembly 100 is mainly disposed near the curved portion 132c of the flexible plate 132 and may be attached to or spaced apart from the inner surface of the flexible plate 132. Besides, the total number of the supporting assembly 100 may be more than one, if required, but not limited thereto.

Figure 5:
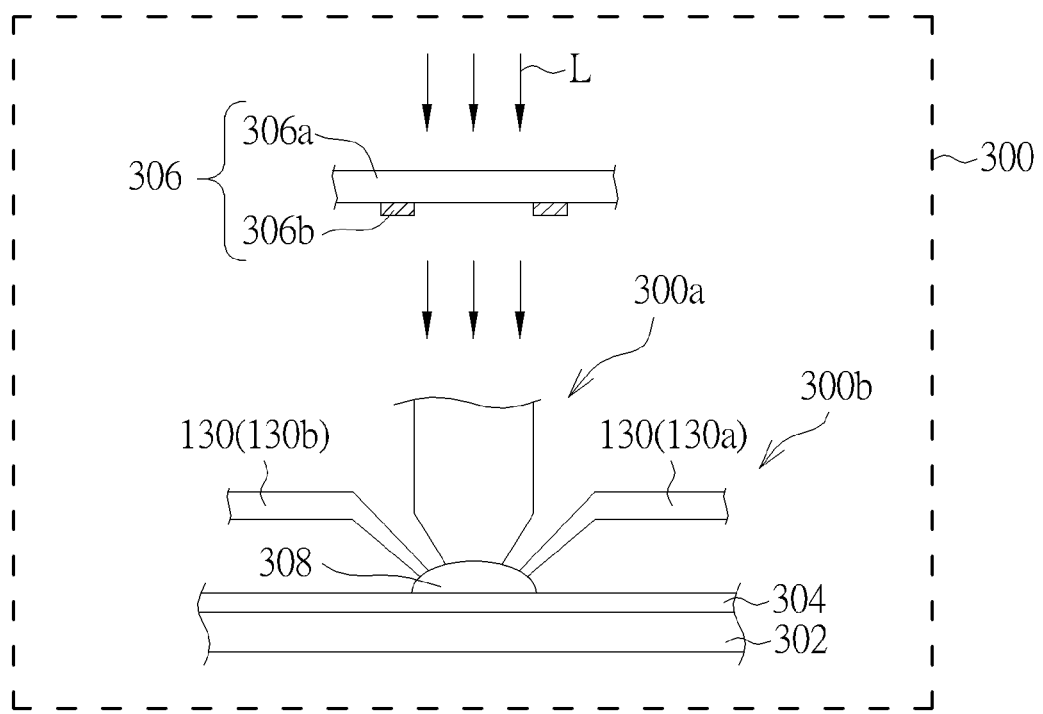
FIG. 5 is a schematic cross-sectional diagram showing an exposure apparatus according to one embodiment of the present invention.

Furthermore, the fabrication apparatus 300 disclosed in the preceding paragraph may be an exposure apparatus, preferably an immersion exposure apparatus used for fabricating a pattern on a semiconductor substrate. Please refer to FIG. 5. FIG. 5 is a schematic cross-sectional diagram showing an exposure apparatus according to one embodiment of the present invention. Referring to FIG. 4 and FIG. 5, the fabrication apparatus 300 shown in FIG. 5 includes at least a projection optical apparatus 300a and a liquid supply apparatus 300b. In detail, the liquid supply apparatus 300b includes two types of tubes, i.e. supply tubes 130a and recovery tubes 130b, which may extend out of the fabrication apparatus 300 to become the tubes 130 shown in FIG. 4. During the process for fabricating a pattern on a semiconductor substrate, a semiconductor substrate 302 and a photomask 306 including a transparent substrate 306a and a pattern 306b may be first transmitted to the fabrication apparatus 300. For example, the semiconductor substrate 302 having a photosensitive layer 304 thereon is first transmitted from another fabrication apparatus, such as a deposition apparatus, into the fabrication apparatus 300. Then, liquids, such as de-ion (DI) water or high-index fluids, are injected from the supply tubes 130a so as to form a drop of liquid 308 or liquid confined by walls on the surface of the photosensitive layer 304. Afterwards, light L generated from a light source may pass through the photomask 306 and be concentrated by the projection optical apparatus 300a. It should be noted that, because a drop of liquid 308 is disposed on the surface of the photosensitive layer 304, light L may be further concentrated by the liquid before it reaches the photosensitive layer 304. Then, the liquid 308 may be further removed by the recovery tubes 130b so as to complete a cycle of the exposure process. In a next step, another cycle of the exposure process may be carried out in order to transfer the pattern from the photomask to another region of the photosensitive layer. It should be noted that since the supply tube 130a and the recovery tube 130b may move over the surface of the semiconductor substrate 302 during the whole exposure process, the tubes 130 extending from the fabrication apparatus 300 may be moved correspondingly. One main characteristic of the present embodiment is that the supporting assembly 100 installed in the support mechanism 200 is able to support the tubes 130 during the whole exposure process. As a result, the tubes 130 are spaced apart from the platform 132 and therefore there is no friction between the tubes 130 and the platform 132.

In the following paragraph, a modification of the first embodiment is disclosed and the description below is mainly focused on differences between these two embodiments. In addition, like or similar features will usually be described with same reference numerals for ease of illustration and description thereof.

Figure 6:
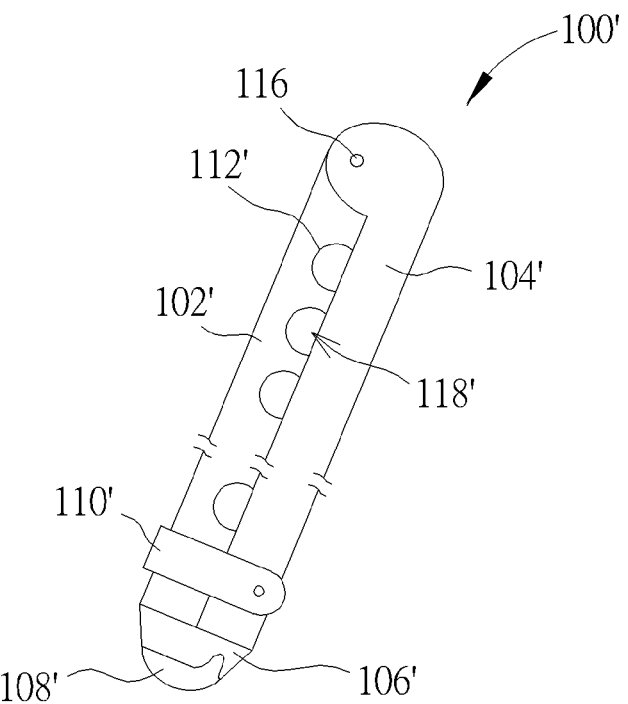
FIG. 6 is a schematic side-view showing a supporting assembly according to one embodiment of the present invention.

Please refer to FIG. 6. FIG. 6 is a schematic side-view showing a supporting assembly according to one embodiment of the present invention. Similarly, the supporting assembly 100' shown in FIG. 6 also includes at least the first supporting rod 102', the second supporting rod 104' disposed opposite to the first supporting rod 102', the bridging member 106', the rolling member 108, and the optional fastening member 110'. However, one main difference between this modification and the first embodiment is that only the first supporting rod 102' has parallel recesses 112' according to this modification while there are no recesses in the second supporting rod 104'. In detail, the parallel recesses 112' are distributed along one side of the first supporting rod 102'. When the first supporting rod 102' and the second supporting rod 104' are set at a locked position, several through holes 118' defined by the parallel recesses 112' and the edge of the second supporting rod 104' are obtained. Similarly, these through holes 118' may be used to receive flexible tubes extending from a fabrication apparatus. The shape of each of the through holes 118' may be semicircle, U-shaped or arc-shaped, but not limited thereto. Apart from the position of the recesses, the rest of the parts of the supporting assembly 100' disclosed in this embodiment, such as positions of other parts, are almost similar to those shown in the supporting assembly 100 according to the previous first embodiment. Besides, operation principles of these two embodiments are also the same. For the sake of brevity, these similar configurations and operation principles are therefore not disclosed in detail.

In summary, a method for fabricating a pattern on a semiconductor substrate and a semiconductor fabrication apparatus are disclosed according to the embodiments of the present invention. One main characteristic of these embodiments is that the tubes extending from the fabrication apparatus are able to be received by the parallel through holes and therefore to be supported by the supporting assembly. In this way, there is no friction between the tubes and the underlying platform. As a result, the tubes may be moved above the underlying platform without wearing out and the lifetime of the tubes may be improved.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for fabricating a pattern on a semiconductor substrate, comprising the steps of:
   (a) providing the semiconductor substrate having a photosensitive layer thereon;
   (b) transmitting the semiconductor substrate to an exposure apparatus comprising a plurality of tubes;
   (c) providing a supporting assembly to support the tubes, wherein the supporting assembly comprises:
      a first supporting rod comprising a plurality of first parallel recesses, wherein the first parallel recesses are configured to receive the tubes;
      a second supporting rod disposed opposite to the first supporting rod;
      a bridging member connected to one end of the first supporting rod or one end of the second supporting rod; and
      a rolling member received by the bridging member;
   (d) providing a photomask to the exposure apparatus, wherein the photomask comprises a pattern; and
   (e) transferring the pattern from the photomask to the photosensitive layer.

2. The method according to claim 1, wherein step (e) further comprises:
   providing a liquid to a surface of the photosensitive layer through the tubes; and
   moving the supporting assembly along a predetermined route.

3. The method according to claim 1, wherein the tubes are received by the first parallel recesses.

4. The method according to claim 1, wherein the rolling member directly contacts an underlying platform.

5. The method according to claim 1, wherein the second supporting rod comprises a plurality of second parallel recesses.

6. The method according to claim 1, wherein the rolling member is a rolling ball disposed directly below the first and second supporting rods.

7. The method according to claim 6, wherein the rolling member is disposed directly below a longitudinal axis of the first and second supporting rods, the rolling member capable of moving the supporting assembly.

8. A semiconductor fabrication apparatus disposed on a platform, comprising:
   an immersion exposure apparatus disposed on the platform, the immersion exposure apparatus comprising:
      a support plate;
      a projection optical lens disposed above the support plate; and
      a plurality of tubes, wherein one end of each of the tubes is disposed between the support plate and the projection optical lens and the other end of each of the tubes extends out of the immersion exposure apparatus; and a supporting assembly disposed on the platform, wherein the supporting assembly comprises:
- a first supporting rod comprising a plurality of first parallel recesses, wherein the first parallel recesses are configured to receive the tubes;
- a second supporting rod disposed opposite to the first supporting rod;
- a bridging member connected to one end of the first supporting rod or one end of the second supporting rod; and
- a rolling member received by the bridging member.

9. The semiconductor fabrication apparatus according to claim 8, wherein the second supporting rod comprises a plurality of second parallel recesses.

10. The semiconductor fabrication apparatus according to claim 8, wherein the rolling member is a rolling ball disposed directly below the first and second supporting rods.

11. The semiconductor fabrication apparatus according to claim 10, wherein the rolling member is disposed directly below a longitudinal axis of the first and second supporting rods, the rolling member capable of moving the supporting assembly.

\* \* \* \* \*